(12) United States Patent
Allen et al.

(10) Patent No.: US 6,602,804 B2
(45) Date of Patent: Aug. 5, 2003

(54) POROUS MATERIALS

(75) Inventors: Craig S. Allen, Lower Gwynedd, PA (US); Nikoi Annan, Willow Grove, PA (US); Robert M. Blankenship, Harleysville, PA (US); Michael K. Gallagher, Landsdale, PA (US); Robert H. Gore, Southampton, PA (US); Angelo A. Lamola, Worcester, PA (US); Yujian You, North Wales, PA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/186,397

(22) Filed: Jul. 1, 2002

(65) Prior Publication Data

US 2003/0004218 A1 Jan. 2, 2003

Related U.S. Application Data

(62) Division of application No. 09/460,326, filed on Dec. 10, 1999, now Pat. No. 6,420,441.
(60) Provisional application No. 60/157,408, filed on Oct. 1, 1999.

(51) Int. Cl.$^7$ .............................. H01L 21/31; C08J 9/02
(52) U.S. Cl. ........................ 438/780; 438/623; 438/781; 438/960; 521/77
(58) Field of Search ................................ 438/780, 781, 438/623, 960; 521/77

(56) References Cited

U.S. PATENT DOCUMENTS

| | | |
|---|---|---|
| 5,384,376 A | 1/1995 | Tunney et al. |
| 5,700,844 A | 12/1997 | Hedrick et al. |
| 5,726,211 A | 3/1998 | Hedrick et al. |
| 5,756,021 A | 5/1998 | Hedrick et al. |
| 5,767,014 A | 6/1998 | Hawker et al. |
| 5,776,990 A | 7/1998 | Hedrick et al. |
| 5,804,607 A | 9/1998 | Hedrick et al. |
| 5,863,996 A | 1/1999 | Graham |
| 5,883,219 A | 3/1999 | Carter et al. |
| 5,895,263 A | 4/1999 | Carter et al. |
| 6,093,636 A | 7/2000 | Carter et al. |
| 6,107,357 A | 8/2000 | Hawker et al. |
| 6,146,749 A | 11/2000 | Miyamoto et al. |
| 6,162,838 A | 12/2000 | Kohl |
| 6,214,748 B1 | 4/2001 | Kobayashi et al. |

FOREIGN PATENT DOCUMENTS

| | | |
|---|---|---|
| EP | 0 553 843 A | 8/1993 |
| EP | 0 838 853 A2 | 4/1998 |
| EP | 1 035 183 | 9/2000 |
| JP | 11-322992 | 11/1999 |
| WO | WO 99 03926 A | 1/1999 |
| WO | WO 00 05297 A | 2/2000 |
| WO | WO 00/31183 | 6/2000 |
| WO | WO 0061834 | 10/2000 |

OTHER PUBLICATIONS

JP60137942A (Matsushita Electric Ind. Co. Ltd) Jul. 22, 1985 (abstract) [online] [retrieved on Dec. 6, 2001]; Retrieved from EPOQUE PAJ Database.
Carter et al., "Polyimide Nanofoams From Phase–Separated Block Copolymers", Electrochemical Society Proceedings, vol. 97–8, pp. 32–43, (1997).
Carter et al., "Polyimide Nanofoams for Low Dielectric Applications", Mat. Res. Soc. Symp. Proc. vol. 381, pp. 79–91, (1995) Materials Research Society.
Remenar et al., "Templating Nanopores into Poly(methyl-silsesquioxane); New Low–Dielectric Coatings Suitable for Microelectronic Applications", Mat Res. Soc. Symp. Proc. 511, pp. 69–75.
Hedrick et al. "High Tg Polyimide Nanofoams Derived from Pyromellitic Dianhydride and 1,1–Bis(4–Aminophenyl)–1–phenyl–2,2,2–trifluoroethane", High Tg Polyimide Nanofoams, pp. 2867–2877.
Trollsas et al., "Hyperbranched Poly(–caprolactone)s", Macromolecules, vol. 31, No. 11 (1998).
Srinivasan et al., "Preparation of Thermally Labile PMMA Particles by Combined Non–aqueous dispersion polymerization and polymer chain transfer", Polymer, vol. 39, Nos. 6–7 (1998).
Hedrick et al., "Templating Nonoporosity in Thin–Film Dielectric Insulators", Adv. Mater. 1998, vol. 10, No. 13.
Patent Abstracts of Japan, vol. 1999, No. 13, Nov. 30, 1999 ★ JP 11 217458 A (Hitachi Chem Co. Ltd.; Asahi Glass Co. Ltd), Aug. 10, 1999 ★abstract★.
Patent Abstracts of Japan, vol. 013, No. 105 (C–575), Mar. 13, 1989 & JP 63 278943 A (NOK Corp), Nov. 16, 1988 ★abstract★.

*Primary Examiner*—Morton Foelak
(74) *Attorney, Agent, or Firm*—S. Matthew Cairns

(57) ABSTRACT

Porous dielectric materials having low dielectric constants useful in electronic component manufacture are disclosed along with methods of preparing the porous dielectric materials. Also disclosed are methods of forming integrated circuits containing such porous dielectric materials.

17 Claims, 4 Drawing Sheets

POROUS MATERIALS

This application is a divisional of application(s) application Ser. No. 09/460,326 filed on Dec. 10, 1999 now U.S. Pat. No. 6,420,441 and also claims benefit of Provisional APPL. Ser No. 60/157,408 filed Oct. 1, 1999.

BACKGROUND OF THE INVENTION

This invention relates generally to porous materials. In particular, this invention relates to the preparation and use of porous films having a low dielectric constant.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components. A method for reducing the dielectric constant of such interlayer, or intermetal, insulating material is to incorporate within the insulating film very small, uniformly dispersed pores or voids.

Porous dielectric matrix materials are well known in the art. One known process of making a porous dielectric involves co-polymerizing a thermally labile monomer with an dielectric monomer to form a block copolymer, followed by heating to decompose the thermally labile monomer unit. See, for example, U.S. Pat. No. 5,776,990. In this approach, the amount of the thermally labile monomer unit is limited to amounts less than about 30% by volume. If more than about 30% by volume of the thermally labile monomer is used, the resulting dielectric material has cylindrical or lamellar domains, instead of pores or voids, which lead to interconnected or collapsed structures upon removal, i.e., heating to degrade the thermally labile monomer unit. See, for example, Carter et. al., *Polyimide Nanofoams from Phase-Separated Block Copolymers, Electrochemical Society Proceedings*, volume 97-8, pages 32–43 (1997). Thus, the block copolymer approach provides only a limited reduction in the dielectric constant of the matrix material.

Another known process for preparing porous dielectric materials disperses thermally removable solid particles in a polymer precursor, polymerizing the polymer precursor without substantially removing the particles, followed by heating the polymer to substantially remove the particles. See, for example, U.S. Pat. No. 5,700,844. In the '844 patent, uniform pore sizes of 0.5 to 20 microns are achieved. However, this methodology is unsuitable for such electronic devices as integrated circuits where feature sizes are expected to go below 0.25 microns.

Other methods of preparing porous dielectric materials are known, but suffer from broad distributions of pore sizes, too large pore size, such as greater than 20 microns, or technologies that are too expensive for commercial use, such as liquid extractions under supercritical conditions.

There is thus a need for improved porous dielectric matrix materials with substantially smaller pore sizes and a greater percent by volume of pores for use in electronic components, and in particular, as an interlayer, or intermetal, dielectric material for use in the fabrication of integrated circuits.

SUMMARY OF THE INVENTION

It has now been surprisingly found that certain polymers incorporated into a dielectric matrix provide, upon processing, porous films having a suitable dielectric constant and sufficiently small pore size for use as insulating material in integrated circuits. Such porogens provide dielectric matrix material having smaller pores, pores of lower degree of polydispersity, and, often, a greater percentage of pores by volume than known porogens.

In a first aspect, the present invention is directed to a method of preparing porous dielectric materials including the steps of: a) dispersing removable polymeric porogen in a B-staged dielectric material; b) curing the B-staged dielectric material to form a dielectric matrix material without substantially degrading the porogen; and c) subjecting the dielectric matrix material to conditions which at least partially remove the porogen to form a porous dielectric material without substantially degrading the dielectric material; wherein the porogen is substantially compatible with the B-staged dielectric material.

In a second aspect, the present invention is directed to porous dielectric matrix materials prepared by the method described above.

In a third aspect, the present invention is directed to a method of preparing an integrated circuit including the steps of: a) depositing on a substrate a layer of a composition including B-staged dielectric material having polymeric porogen dispersed therein; b) curing the B-staged dielectric material to form a dielectric matrix material without substantially removing the porogen; c) subjecting the dielectric matrix material to conditions which at least partially remove the porogen to form a porous dielectric material layer without substantially degrading the dielectric material; d) patterning the dielectric layer; e) depositing a metallic film onto the patterned dielectric layer; and f) planarizing the film to form an integrated circuit; wherein the porogen is substantially compatible with the B-staged dielectric material.

In a fourth aspect, the present invention is directed to an integrated circuit prepared by the method described above.

In a fifth aspect, the present invention is directed to a composition including a B-staged dielectric material and a polymeric porogen, wherein the porogen is substantially compatible with the B-staged dielectric material.

DETAILED DESCRIPTION OF THE INVENTION

Figure 1:
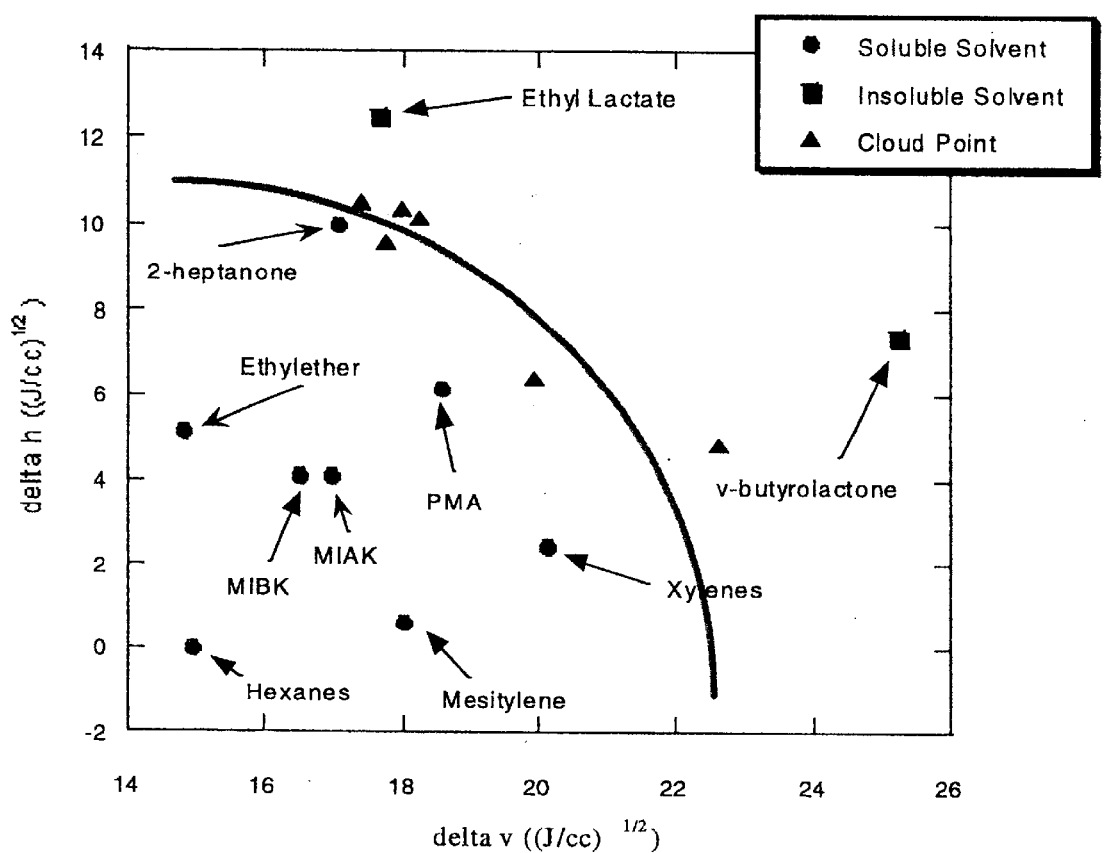
FIG. 1 illustrates a partial plot of the area of solubility parameters for hydrogen silsesquioxane.

As used throughout this specification, the following abbreviations shall have the following meanings, unless the context clearly indicates otherwise: C=centigrade; μm=micron; UV=ultraviolet; rpm=revolutions per minute; nm=nanometer; J=joules; cc=cubic centimeter; g=gram; wt %=weight percent; L=liter; mL=milliliter; MIAK=methyl iso-amyl ketone; MIBK=methyl iso-butyl ketone; PMA=poly(methyl acrylate); CyHMA=cyclohexylmethacrylate; EG=ethylene glycol; DPG=dipropylene glycol; DEA=diethylene glycol ethyl ether acetate; BzA=benzylacrylate; BzMA=benzyl methacrylate; MAPS=MATS=(trimethoxylsilyl)propylmethacrylate; PETTA= pentaerythriol tetra/triacetate; PPG4000DMA= polypropyleneglycol 4000 dimethacrylate; DPEPA= dipentaerythriol pentaacrylate; TMSMA=trimethylsilyl methacrylate; MOPTSOMS=methacryloxypropylbis (trimethylsiloxy)methylsilane; MOPMDMOS=3-methacryloxypropylmethyldimethoxysilane; TAT=triallyl-1,3,5-triazine-2,4,6-(1H,3H,5H)-trione; IBOMA=isobornyl methacrylate; PGMEA=propyleneglycol monomethylether acetate; and PGDMA=propyleneglycol dimethacrylate.

The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "porogen" refers to a pore forming material, that is a polymeric material dispersed in a dielectric material that is subsequently removed to yield pores or voids in the dielectric material. Thus, the term "removable porogen" will be used interchangeably with "removable polymer" or "removable particle" throughout this specification. The terms "pore" and "void" are used interchangeably throughout this specification. "Cross-linker" and "cross-linking agent" are used interchangeably throughout this specification.

The term "B-staged" refers to uncured dielectric matrix materials. By "uncured" is meant any material that can be polymerized or cured, such as by condensation, to form higher molecular weight materials, such as coatings or films. Such B-staged material may be monomeric, oligomeric or mixtures thereof. B-staged material is further intended to include mixtures of polymeric material with monomers, oligomers or a mixture of monomers and oligomers. The terms "oligomer" and "oligomeric" refer to dimers, trimers, tetramers and the like.

Particle sizes were determined using standard dynamic light scattering techniques. All correlation functions were converted to hydrodynamic sizes using LaPlace inversion methods, such as CONTIN. Unless otherwise noted, all amounts are percent by weight and all ratios are by weight. All numerical ranges are inclusive.

The present invention relates to the synthesis, composition, size, distribution and purity of polymer particles useful as removable porogens, i.e., pore forming material. Such porogens are useful for forming porous dielectric materials in the fabrication of electronic devices, particularly multilevel integrated circuits, e.g. memory and logic chips, thereby increasing their performance and reducing their cost.

Thus the present invention relates to a method of preparing porous dielectric materials. The process includes the steps of: a) dispersing a removable polymeric porogen in a B-staged dielectric material; b) curing the B-staged dielectric material to form a dielectric matrix material without substantially removing the porogen; and c) subjecting the dielectric matrix material to conditions which at least partially remove the porogen to form a porous dielectric material layer without substantially degrading the dielectric material layer; wherein the porogen polymer particle is substantially compatible with the dielectric matrix material; wherein the porogen polymer particle is cross-linked; the porogen having a particle size suitable for use as a modifier in advanced interconnect structures in electronic devices. Typically, the useful particle size range for such applications is up to about 1,000 nm, such as that having a mean particle size in the range of about 1 to about 1000 nm. It is preferred that the mean particle size is in the range of about 1 to about 200 nm, more preferably from about 1 to about 50 nm, and most preferably from about 1 nm to about 20 nm. An advantage of the present process is that the size of the pores formed in the dielectric matrix are substantially the same size, i.e., dimension, as the size of the removed porogen particles used. Thus, the porous dielectric material made by the process of the present invention has substantially uniformly dispersed pores with substantially uniform pore sizes having a mean pore size in the range of from 1 to 1000 nm, preferably 1 to 200 nm, more preferably 1 and 50 nm and most preferably 1 to 20 nm.

The porogen useful in the present invention is any polymeric material that does not substantially react with the B-staged dielectric material, is substantially removable under conditions that do not adversely affect the cured dielectric matrix material and provides sufficiently small pores to reduce the dielectric constant of the dielectric material while minimizing crosstalk or capacitive coupling. Suitable polymers include cross-linked solution polymers and cross-linked emulsion polymers.

The polymers suitable for use as porogens in the present invention are derived from ethylenically or acetylenically unsaturated monomers and are removable, such as by the unzipping of the polymer chains to the original monomer units which are volatile and diffuse readily through the host matrix material. By "removable" is meant that the polymer particles depolymerize, degrade or otherwise break down into volatile components which can then diffuse through the host dielectric matrix film. Suitable unsaturated monomers include, but are not limited to: (meth)acrylic acid, (meth)acrylamides, alkyl(meth)acrylates, alkenyl(meth)acrylates, aromatic(meth)acrylates, vinyl aromatic monomers, nitrogen-containing compounds and their thio-analogs, and substituted ethylene monomers.

Typically, the alkyl(meth)acrylates useful in the present invention are ($C_1$–$C_{24}$)alkyl(meth)acrylates. Suitable alkyl (meth)acrylates include, but are not limited to, "low cut" alkyl(meth)acrylates, "mid cut" alkyl(meth)acrylates and "high cut" alkyl(meth)acrylates.

"Low cut" alkyl(meth)acrylates are typically those where the alkyl group contains from 1 to 6 carbon atoms. Suitable low cut alkyl(meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl(meth)acrylates are typically those where the alkyl group contains from 7, to 15 carbon atoms. Suitable mid cut alkyl(meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl(meth)acrylates are typically those where the alkyl group contains from 16 to 24 carbon atoms. Suitable high cut alkyl(meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl(meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl(meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed Alfol alcohols from Vista Chemical company, i.e., Alfol 1618 and Alfol 1620, Ziegler catalyzed various Neodol alcohols from Shell Chemical Company, i.e. Neodol 25L, and naturally derived alcohols such as Proctor & Gamble's TA-1618 and CO-1270. Consequently, for the purposes of this invention, alkyl(meth)acrylate is intended to include not only the individual alkyl(meth)acrylate product named, but also to include mixtures of the alkyl(meth)acrylates with a predominant amount of the particular alkyl (meth)acrylate named.

The alkyl(meth)acrylate monomers useful in the present invention may be a single monomer or a mixture having different numbers of carbon atoms in the alkyl portion. Also, the (meth)acrylamide and alkyl(meth)acrylate monomers useful in the present invention may optionally be substituted. Suitable optionally substituted (meth)acrylamide and alkyl(meth)acrylate monomers include, but are not limited to: hydroxy($C_2$–$C_6$)alkyl(meth)acrylates, dialkylamino ($C_2$–$C_6$)-alkyl(meth)acrylates, dialkylamino($C_2$–$C_6$)alkyl (meth)acrylamides.

Particularly useful substituted alkyl(meth)acrylate monomers are those with one or more hydroxyl groups in the alkyl radical, especially those where the hydroxyl group is found at the β-position (2-position) in the alkyl radical. Hydroxyalkyl(meth)acrylate monomers in which the substituted alkyl group is a ($C_2$–$C_6$)alkyl, branched or unbranched, are preferred. Suitable hydroxyalkyl(meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl(meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or "HPMA."

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl)acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl(meth)acrylate, γ-propyl tri ($C_1$–$C_6$)alkylsilyl(meth)acrylate, γ-propyl di($C_1$–$C_6$)alkoxy ($C_1$–$C_6$)alkylsilyl(meth)acrylate, γ-propyl di($C_1$–$C_6$)alkyl ($C_1$–$C_6$)alkoxysilyl(meth)acrylate, vinyl tri($C_1$–$C_6$) alkoxysilyl(meth)acrylate, vinyl di($C_1$–$C_6$)alkoxy($C_1$–$C_6$) alkylsilyl(meth)acrylate, vinyl($C_1$–$C_6$)alkoxydi($C_1$–$C_6$) alkylsilyl(meth)acrylate, vinyl tri($C_1$–$C_6$)alkylsilyl(meth) acrylate, and mixtures thereof.

The vinylaromatic monomers useful as unsaturated monomers in the present invention include, but are not limited to: styrene ("STY"), α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$) alkyl, carb($C_1$–$C_{10}$)alkoxy, carboxy, amino, ($C_1$–$C_{10}$) alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl($C_1$–$C_8$) substituted N-vinyl pyridines such as 2-methyl-5-vinylpyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-diethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: allylic monomers, vinyl acetate, vinyl formamide, vinyl chloride, vinyl fluoride, vinyl bromide, vinylidene chloride, vinylidene fluoride and vinylidene bromide.

The solution polymers useful in the present invention may be linear or branched and may be copolymers or homopolymers. Suitable solution polymers useful in the present invention include, but are not limited to: butyl acrylate homopolymers, ethylhexyl acrylate-methyl methacrylate copolymers, isodecyl methacrylate-methyl methacrylate copolymers, butyl acrylate-methyl methacrylate copolymers, and benzyl methacrylate-methyl methacrylate copolymers. Typically, the molecular weight of these polymers is in the range of 10,000 to 1,000,000, preferably 20,000 to 500,000, and more preferably 20,000 to 100,000. The polydispersity of these materials is in the range of 1 to 20, preferably 1.001 to 15, and more preferably 1.001 to 10.

The solution polymers of the present invention are prepared in a non-aqueous solvent. Suitable solvents for such polymerizations are well known to those skilled in the art. Examples of such solvents include, but are not limited to: hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and t-butanol.

The solution polymers of the present invention are generally prepared by first charging a solvent heel or alternatively a mixture of solvent and some portion of the monomer mixture to a reaction vessel equipped with a stirrer, a thermometer and a reflux condenser. The monomer mixture is typically composed of monomer, initiator and chain transfer agent, as appropriate. The solvent or solvent/monomer mixture heel is heated with stirring under a nitrogen blanket to a temperature from about 55° C. to about 125° C. After the heel charge has reached a temperature sufficient to initiate polymerization, the monomer mixture or balance of the monomer mixture is charged to the reaction vessel over a period of 15 minutes to 4 hours while maintaining the reaction at the desired reaction temperature. After completing the monomer mixture addition, a series of additional aliquots of initiator in solvent are charged to the reaction. Typically, the initiator is charged to the reaction and followed by a hold period to allow for reaction to occur before adding the next initiator amount. Typically three initiator additions are used. After the final initiator amount is added the batch is held for 30 minutes to 4 hours to fully decompose all initiator and drive the reaction to completeness. An alternative method is to first charge both solvent and a portion of the monomer mixture to the reaction vessel.

The emulsion polymers useful in the present invention are generally prepared by first charging water and some portion of the monomer emulsion to a reaction vessel equipped with a stirrer, a thermometer and a reflux condenser. Typically, the monomer emulsion is composed of monomer, surfactant, initiator and chain transfer agent, as appropriate. The initial charge of monomer emulsion is heated with stirring under a nitrogen blanket to a temperature of from about 55° C. to about 125° C. After the seed charge has reached a temperature sufficient to initiate polymerization, the monomer emulsion or balance of the monomer emulsion is charged to the reaction vessel over a period of 15 minutes to 4 hours while maintaining the reaction at the desired reaction temperature. After completing the monomer emulsion addition, a series of additional aliquots of initiator in water are charged to the reaction. Typically the initiator is charged to the reaction and followed by a hold period to allow for reaction to occur before adding the next initiator amount. Typically three initiator additions are used. After the final initiator amount is added, the batch is held for 30 minutes to 4 hours to fully decompose all initiator and drive the reaction to completeness.

In the alternative, the emulsion polymerization may be carried out in a batch process. In such a batch process, the emulsion polymers are prepared by charging water, monomer, surfactant, initiator and chain transfer agent, as appropriate, to a reaction vessel with stirring under a nitrogen blanket. The monomer emulsion is heated to a temperature of from about 55° C. to about 125° C. to carry out the polymerization. After 30 minutes to 4 hours at this temperature, a series of additional aliquots of initiator are charged to the reaction vessel. Typically the initiator is charged to the reaction vessel followed by a hold period to allow for reaction to occur before adding the next amount of initiator. Typically three initiator additions are used. After the final initiator amount is added, the batch is held for 30 minutes to 4 hours to fully decompose all initiator and drive the reaction to completeness.

It is preferred that the polymers of the present invention are prepared using anionic polymerization or free radical polymerization techniques. It is also preferred that the polymers useful in the present invention are not prepared by step-growth polymerization processes.

The polymer particle porogens of the present invention include cross-linked polymer chains. Any amount of cross-linker is suitable for use in the present invention. Typically, the porogens of the present invention contain at least 1% by weight, based on the weight of the porogen, of cross-linker. Up to and including 100% cross-linking agent, based on the weight of the porogen, may be effectively used in the particles of the present invention. It is preferred that the amount of cross-linker is from about 1% to about 80%, and more preferably from about 1% to about 60%. It will be appreciated by those skilled in the art that as the amount of cross-linker in the porogen increases, the conditions for removal of the porogen from the dielectric matrix may change.

Suitable cross-linkers useful in the present invention include di-, tri-, tetra-, or higher multi-functional ethylenically unsaturated monomers. Examples of cross-linkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly(phenyl vinyl siloxane) and mixtures thereof.

Suitable polymers useful as porogens in the present invention include, but are not limited to: HEMA/DEGDMA, MMA/DEGDMA, MMA/MAPS/DEGDMA, MMA/MAPS/PETTA, MMA/MAPS/PPG4000DMA, MMA/MAPS/DPEPA, MAPS/DEGDMA, BA/DEGDMA, MMA/MAPS/TMPTMA, MMA/MAPS/DVB, STY/MAPS/DVB, BA/MAPS/DVB, BA/TMSMA/DVB, BA/MOPTSOMS/DVB, BA/MOPMDMOS/DVB, BA/MAPS/TAT, ALMA/BA/DVB, IBOMA/MAPS/DVB, IBOA/MAPS/DVB, BA/DVB, BA/PGDMA, BA/ALMA, BA/TMPTMA, BA/DPEPA, EHA/DVB, EHA/ALMA, EHA/TMPTMA, EHA/DPEPA, STY/DVB, STY/ALMA, EHA/STY/ALMA, MMA/BA/ALMA, STY/MMA/DVB, MMA/butadiene/ STY, MMA/EA/ALMA, BA/ALMA/MATS, STY/MATS/ DVB, MMA/BA/MATS, STY/MMA/MATS/DVB, MMA/ BA/MATS/ALMA, BzA/TMPTMA, BzA/DVB, IDMA/ BzMA and MMA/ALMA/MATS.

Particle size and particle size distribution are key parameters that have to be controlled if the desired dielectric layer or film, namely a porous film suitable for use in the preparation of semiconductor devices, is to be achieved. Control of particle size and distribution can be achieved by such methods as choice of solvent, choice of initiator, total solids level, initiator level and reaction conditions.

Initiators useful in the free radical polymerization of porogens of the present invention include, but are not limited to, one or more of: peroxyesters, dialkylperoxides, alkylhydroperoxides, persulfates, azoinitiators, redox initiators and the like. Particularly useful free radical initiators include, but are not limited to: benzoyl peroxide, t-butyl peroctoate, t-amyl peroxypivalate, cumene hydroperoxide, and azo compounds such as azoisobutylnitrile and 2,2'-azobis(2-methylbutanenitrile). When such free radical initiators are used, part of the initiator is incorporated into the polymer as end groups. It is preferred that the free radical initiator is t-amyl peroxypivalate. The amount of the free radical initiator used is typically from 0.05 to 10% by weight, based on the weight of total monomer.

Chain transfer reagents may optionally be used to prepare the polymers useful in the present invention. Suitable chain transfer agents include, but are not limited to: alkyl mercaptans such as dodecyl mercaptan, and aromatic hydrocarbons with activated hydrogens such as toluene. When the porous dielectric material of the present invention is used in a semiconductor, it is preferred that the optional chain transfer agent is not a sulfur-containing chain transfer agent.

The porogen particles of the present invention may be directly added to the B-staged dielectric matrix material as is or may be first purified to remove impurities that might affect the electrical or physical properties of electronic devices. Purification of the porogen particles may be accomplished either by precipitation of the porogen particles or adsorption of the impurities.

The solution polymer porogens of the present invention typically have a weight average molecular weight in the range of 10,000 to 1,000,000, preferably in the range of 20,000 to 500,000 and more preferably in the range of 20,000 to 100,000. The solution polymer porogens typically have a mean particle size up to about 1,000 nm, such as in the range of 1 to 1000 nm. It is preferred that the mean particle size is in the range of about 1 to about 200 nm, more preferably from about 1 about 50 nm, and most preferably from about 1 nm to about 20 nm. The polydispersity of these solution polymers is in the range 1 to 20 and more preferably in the range of 1.001 to 15 and most preferably in the range of 1.001 to 10.

The emulsion polymer porogens of the present invention typically have a weight average molecular weight in the range of 1000 to 10,000,000, preferably 100,000 to 5,000,000, and more preferably 100,000 to 1,000,000. The emulsion polymer porogens of the present invention typically have a mean particle size up to about 1,000 nm, such as in the range of 1 to 1000 nm. It is preferred that the particle size is in the range of about 1 to about 200 nm, more preferably from about 1 about 50 nm, and most preferably from about 1 nm to about 20 nm. The polydispersity of these emulsion polymer porogen particles is in the range 1.0001 to 10, more preferably 1.001 to 5, and most preferably 1.001 to 2.5.

The polymer porogens of the present invention may also be post-functionalized. Such post-functionalization may be by any techniques known in the art. Post-polymerization functionalization of the porogens may be advantageous, such as in further compatiblizing the porogen with the dielectric material.

To be useful as porogens in forming porous dielectric materials, the porogens of the present invention must be at least partially removable under conditions which do not adversely affect the dielectric matrix material, preferably substantially removable, and more preferably completely removable. By "removable" is meant that the polymer depolymerizes or otherwise breaks down into volatile components or fragments which are then removed from, or migrate out of, the dielectric material yielding pores or voids. Any procedures or conditions which at least partially remove the porogen without adversely affecting the dielectric matrix material may be used. It is preferred that the porogen is substantially removed. Typical methods of removal include, but are not limited to, exposure to heat, pressure or radiation, such as, but not limited to, actinic, IR, microwave, UV, x-ray, gamma ray, alpha particles, neutron beam or electron beam. It is preferred that the matrix material is exposed to heat or UV light to remove the porogen.

The porogens of the present invention can be thermally removed under vacuum, nitrogen, argon, mixtures of nitrogen and hydrogen, such as forming gas, or other inert or reducing atmosphere. The porogens of the present invention may be removed at any temperature that is higher than the thermal curing temperature and lower than the thermal decomposition temperature of the dielectric matrix material. Typically, the porogens of the present invention may be removed at temperatures in the range of 150° to 450° C. and preferably in the range of 250° to 425° C. Typically, the porogens of the present invention are removed upon heating for a period of time in the range of 1 to 120 minutes. An advantage of the porogens of the present invention is that 0 to 20% by weight of the porogen remains after removal from the dielectric matrix material.

In one embodiment, when a porogen of the present invention is removed by exposure to radiation, the porogen polymer is typically exposed under an inert atmosphere, such as nitrogen, to a radiation source, such as, but not limited to, visible or ultraviolet light. While not intending to be bound by theory, it is believed that porogen fragments form, such as by radical decomposition, and are removed from the matrix material under a flow of inert gas. The energy flux of the radiation must be sufficiently high such that porogen particles are at least partially removed. It will be appreciated by those skilled in the art that a combination of heat and radiation may be used to remove the porogens of the present invention. It will also be appreciated by those skilled in the art that other methods of porogen removal, such as by atom abstraction, may be employed.

The porogens of the present invention are useful in reducing the dielectric constant of dielectric materials, particularly low dielectric constant ("k") materials. A low k dielectric material is any material having a dielectric constant less than 4. Suitable dielectric materials useful in the present invention include, but are not limited to: inorganic matrix materials such as carbides, oxides, nitrides and oxyfluorides of silicon, boron, or aluminum; silicones;

siloxanes, such as silsesquioxanes; silicates; silazanes; and organic matrix materials such as benzocyclobutenes, poly (aryl esters), poly(ether ketones), polycarbonates, polyimides, fluorinated polyimides, polynorbornenes, poly (arylene ethers), polyaromatic hydrocarbons, such as polynaphthalene, polyquinoxalines, poly(perfluorinated hydrocarbons) such as poly(tetrafluoroethylene), and polybenzoxazoles. Particularly suitable dielectric materials are available under the tradenames Teflon, Avatrel, BCB, Aerogel, Xerogel, Parylene F, and Parylene N. Suitable silsesquioxane compositions include, but are not limited to hydrogen silsesquioxane, alkyl silsesquioxane such as methyl silsesquioxane, aryl silsesquioxane such as phenyl silsesquioxane, and mixtures thereof, such as alkyl/hydrogen, aryl/hydrogen or alkyl/aryl silsesquioxane. It is preferred that the dielectric material is a silsesquioxane. It is more preferred that the dielectric material is hydrogen silsesquioxane, methyl silsesquioxane, phenyl silsesquioxane, a mixture of dielectric materials containing hydrogen silsesquioxane as a predominant component, or mixtures thereof, and most preferably hydrogen silsesquioxane or a mixture of dielectric materials containing hydrogen silsesquioxane as a predominant component. Such dielectric materials are commercially available or may be prepared by known methods. For example the preparation of hydrogen silsesquioxanes is disclosed in U.S. Pat. No. 3,615,272, herein by reference to the extent it teaches the preparation of this compound. Typically, the silsesquioxanes useful in the present invention are used as oligomeric materials, generally having from 8 to 20 repeating units.

In preparing the dielectric matrix materials of the present invention, the porogens described above are first dispersed within, or dissolved in, a B-staged dielectric material. Any amount of porogen may be combined with the B-staged dielectric materials according to the present invention. The amount of porogen used will depend on the particular porogen employed, the particular B-staged dielectric material employed, and the extent of dielectric constant reduction desired in the resulting porous dielectric material. Typically, the amount of porogen used is in the range of from 1 to 90 wt %, based on the weight of the B-staged dielectric material, preferably from 10 to 80 wt %, more preferably from 15 to 60 wt %, and even more preferably from 20 to 30 wt %.

The porogens of the present invention may be combined with the B-staged dielectric material by any methods known in the art. Typically, the B-staged matrix material is first dissolved in a suitable high boiling solvent, such as methyl isobutyl ketone, diisobutyl ketone, 2-heptanone, γ-butyrolactone, γ-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes, or mixtures thereof to form a solution. The porogen particles are then dispersed or dissolved within the solution. The resulting dispersion is then deposited on a substrate by methods known in the art, such as spin coating, spray coating or doctor blading, to form a film or layer.

After being deposited on a substrate, the B-staged dielectric material is then substantially cured to form a rigid, cross-linked dielectric matrix material without substantially removing the porogen particle. The curing of the dielectric material may be by any means known in the art including, but not limited to, heating to induce condensation or e-beam irradiation to facilitate free radical coupling of the oligomer or monomer units. Typically, the B-staged material is cured by heating at an elevated temperature, e.g. either directly or in a step-wise manner, e.g. 200° C. for 2 hours and then ramped up to 300° C. at a rate of 5° C. per minute and held at this temperature for 2 hours. Such curing conditions are known to those skilled in the art.

Once the B-staged dielectric material is cured, the film is subjected to conditions which remove the porogen without substantially degrading the dielectric matrix material, that is, less than 5% by weight of the dielectric matrix material is lost. Typically, such conditions include exposing the film to heat and/or radiation. It is preferred that the matrix material is exposed to heat or light to remove the porogen. To remove the porogen thermally, the dielectric matrix material can be heated by oven heating or microwave heating. Under typical thermal removal conditions, the polymerized dielectric matrix material is heated to about 350° to 400° C. It will be recognized by those skilled in the art that the particular removal temperature of a thermally labile porogen will vary according to composition of the porogen. Upon removal, the porogen polymer depolymerizes or otherwise breaks down into volatile components or fragments which are then removed from, or migrate out of, the dielectric matrix material yielding pores or voids, which fill up with the carrier gas used in the process. Thus, a porous dielectric material having voids is obtained, where the size of the voids is substantially the same as the particle size of the porogen. The resulting dielectric material having voids thus has a lower dielectric constant than such material without such voids.

In general, the polymers of the present invention useful as porogens must be dispersible, miscible or otherwise substantially compatible with the host dielectric matrix material in solution and in the thin film. Thus, the porogen must be soluble in the same solvent or mixed solvent system as the host dielectric B-staged material. Also, the porogen must be present within this solution as substantially discrete, substantially non-aggregated or substantially non-agglomerated particles in order to achieve the desired benefit of this invention, namely substantially uniformly dispersed pores with a size comparable to that of the porogen's size. This is accomplished by modifying the porogen composition such that it is "compatible" with the host dielectric matrix material. Thus, the use of the appropriate substituted or functional monomers at an appropriate concentration in the preparation of the porogen allows for complete dispersion, or preferably dissolution, of the porogen polymers of the present invention into the host dielectric B-staged material.

The porogens of the present invention are selected so as to be substantially compatible, and preferably compatible, with the dielectric material used. By "compatible" is meant that a composition of B-staged dielectric material and porogen are optically transparent to visible light. It is preferred that a solution of B-staged dielectric material and porogen, a film or layer including a composition of B-staged dielectric material and porogen, a composition including a dielectric matrix material having porogen dispersed therein, and the resulting porous dielectric material after removal of the porogen are all optically transparent to visible light. By "substantially compatible" is meant that a composition of B-staged dielectric material and porogen is slightly cloudy or slightly opaque. Preferably, "substantially compatible" means at least one of a solution of B-staged dielectric material and porogen, a film or layer including a composition of B-staged dielectric material and porogen, a composition including a dielectric matrix material having porogen dispersed therein, and the resulting porous dielectric material after removal of the porogen is slightly cloudy or slightly opaque.

To be compatible, the porogen must be soluble or miscible in the B-staged dielectric material, in the solvent used to dissolve the B-staged dielectric material or both. When a film or layer of a composition including the B-staged dielectric material, porogen and solvent is cast, such as by spin casting, much of the solvent evaporates. After such film casting, the porogen must be soluble in the B-staged dielectric material so that it remains substantially uniformly dispersed. If the porogen is not compatible, phase separation of the porogen from the B-staged dielectric material occurs and large domains or aggregates form, resulting in an increase in the size and non-uniformity of pores. Such compatible porogens provide cured dielectric materials having substantially uniformly dispersed pores having substantially the same sizes as the porogen particles.

The compatibility of the porogens and dielectric matrix material is typically determined by a matching of their solubility parameters, such as the Van Krevelen parameters of delta h and delta v. See, for example, Van Krevelen et al., *Properties of Polymers. Their Estimation and Correlation with Chemical Structure*, Elsevier Scientific Publishing Co., 1976; Olabisi et al., *Polymer-Polymer Miscibility*, Academic Press, NY, 1979; Coleman et al., *Specific Interactions and the Miscibility of Polymer Blends*, Technomic, 1991; and A. F. M. Barton, *CRC Handbook of Solubility Parameters and Other Cohesion Parameters*, $2^{nd}$ Ed., CRC Press, 1991. Delta h is a hydrogen bonding parameter of the material and delta v is a measurement of both dispersive and polar interaction of the material. Such solubility parameters may either be calculated, such as by the group contribution method, or determined by measuring the cloud point of the material in a mixed solvent system consisting of a soluble solvent and an insoluble solvent. The solubility parameter at the cloud point is defined as the weighted percentage of the solvents. Typically, a number of cloud points are measured for the material and the central area defined by such cloud points is defined as the area of solubility parameters of the material.

When the solubility parameters of the porogen and dielectric matrix material are substantially similar, the porogen will be compatible with the dielectric matrix material and phase separation and/or aggregation of the porogen is less likely to occur. It is preferred that the solubility parameters, particularly delta h and delta v, of the porogen and dielectric matrix material are substantially matched. It will be appreciated by those skilled in the art that the properties of the porogen that affect the porogen's solubility also affect the compatibility of that porogen with the B-staged dielectric material. It will be further appreciated by those skilled in the art that a porogen may be compatible with one B-staged dielectric material, but not another. This is due to the difference in the solubility parameters of the different B-staged dielectric materials.

Typically, porogens that are compatible with hydrogen silsesquioxane have lower glass transition temperatures ("Tg's"), a greater proportion of branched alkyl groups, or both in comparison with porogens that are not compatible. It is preferred that porogens used with hydrogen silsesquioxane contain a lower proportion of phenyl groups. Thus, it is preferred that the porogens used with hydrogen silsesquioxane do not contain styrene or benzyl(meth)acrylate. Particularly preferred porogens for use with hydrogen silsesquioxane comprise EHA, more preferably 90% EHA and 10% cross-linking agent, and most preferably 90% EHA and 10% of ALMA, TMPTMA or mixtures thereof. Particularly preferred porogens for use with methyl silsesquioxane comprise MAPS, more preferably 80% MAPS, and most preferably 10% MMA/80% MAPS/10% DVB.

The compatible, i.e., optically transparent, compositions of the present invention do not suffer from agglomeration or long range ordering of porogen materials, i.e. the porogen is substantially uniformly dispersed throughout the B-staged dielectric material. Thus, the porous dielectric materials resulting from removal of the porogen have substantially uniformly dispersed pores. Such substantially uniformly dispersed, very small pores are very effective in reducing the dielectric constant of the dielectric materials.

An advantage of the present invention is that low dielectric constant materials are obtained having uniformly dispersed voids, a higher volume of voids than known dielectric materials and/or smaller void sizes than known dielectric materials. These voids have a mean particle size on the order of 1 to 1000 nm, preferably 1 to 200 nm, more preferably 1 to 50 nm, and most preferably 1 to 20 nm. Further, the void size can be adjusted, from 1 to 1000 nm and above, by varying the size of the removable porogen particles. The resulting dielectric matrix material has low stress, low dielectric constant, improved toughness and improved compliance during mechanical contacting to require less contact force during compression.

A further advantage of the present invention is that porous dielectric materials are obtained having less surface roughness than known porous dielectric materials. In general, the surfaces of the dielectric materials of the present invention show very little light scattering. Such smooth surfaces have the advantage that subsequent layers of materials applied to the dielectric material are smoother, i.e. flatter. This is particularly advantageous in the manufacture of integrated circuits.

The porous dielectric material made by the process of the present invention is suitable for use in any application where a low refractive index or low dielectric material may be used. When the porous dielectric material of the present invention is a thin film, it is useful as insulators, anti-reflective coatings, sound barriers, thermal breaks, insulation, optical coatings and the like. The porous dielectric materials of the present invention are preferably useful in electronic devices including, but not limited to, the fabrication of multilevel integrated circuits, e.g. memory and logic chips, thereby increasing their performance and reducing their cost.

The porous dielectric matrix materials of the present invention are particularly suitable for use in integrated circuit manufacture. In one embodiment of integrated circuit manufacture, as a first step, a layer of a composition including B-staged dielectric material having a polymeric porogen dispersed or dissolved therein and optionally a solvent is deposited on a substrate. Suitable deposition methods include spin casting, spray casting and doctor blading. Suitable optional solvents include, but are not limited to: methyl isobutyl ketone, diisobutyl ketone, 2-heptanone, γ-butyrolactone, γ-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes or mixtures thereof. Suitable substrates include, but are not limited to: silicon, silicon dioxide, glass, silicon nitride, ceramics, aluminum, copper, gallium arsenide, plastics, such as polycarbonate, circuit boards, such as FR-4 and polyimide, and hybrid circuit substrates, such as aluminum nitride-alumina. Such substrates may further include thin films deposited thereon, such films including, but not limited to: metal nitrides, metal carbides, metal silicides, metal oxides, and mixtures thereof. In a multilayer integrated circuit device, an underlying layer of insulated, planarized circuit lines can also function as a substrate.

In a second step in the manufacture of integrated circuits, the layer of the composition is heated to an elevated temperature to cure the B-staged dielectric material to form a dielectric matrix material without degrading the polymeric porogen. A catalyst, such as a Brønsted or Lewis base or Brønsted or Lewis acid, may also be used. In a third step, the resulting cured dielectric matrix material is then subjected to conditions such that the porogen contained therein is substantially removed without adversely affecting the dielectric matrix material to yield a porous dielectric material.

The porous dielectric material is then lithographically patterned to form trenches. The trenches generally extend to the substrate and to at least one metallic via. Typically, lithographic patterning involves (i) coating the dielectric material layer with a positive or negative photoresist, such as those marketed by Shipley Company (Marlborough, Mass.); (ii) imagewise exposing, through a mask, the photoresist to radiation, such as light of appropriate wavelength or e-beam; (iii) developing the image in the resist, e.g., with a suitable developer; and (iv) transferring the image through the dielectric layer to the substrate with a suitable transfer technique such as reactive ion etching. Such lithographic pattering techniques are well known to those skilled in the art.

A metallic film is then deposited onto the patterned dielectric layer to fill the trenches. Preferred metallic materials include, but are not limited to: copper, platinum, tungsten, gold, silver, aluminum or alloys thereof. The metal is typically deposited onto the patterned dielectric layer by techniques well known to those skilled in the art. Such techniques include, but are not limited to: chemical vapor deposition ("CVD"), plasma-enhanced CVD, electrolytic and electroless deposition, sputtering, or the like. Optionally, a metallic liner, such as a layer of nickel, tantalum or chromium, or other layers such as barrier or adhesion layers, e.g. silicon nitride or titanium nitride, is deposited on the patterned and etched dielectric material.

In a fifth step of the process for integrated circuit manufacture, excess metallic material is removed, e.g. by planarizing the metallic film, so that the resulting metallic material is generally level with the patterned dielectric layer. Planarization is typically accomplished with chemical/mechanical polishing or selective wet or dry etching. Such planarization methods are well known to those skilled in the art.

It will be appreciated by those skilled in the art that multiple layers of dielectric material and metal layers may subsequently be applied by repeating the above steps. It will be further appreciated by those skilled in the art that the compositions of the present invention are useful in any and all methods of integrated circuit manufacture.

The following examples are presented to illustrate further various aspects of the present invention, but are not intended to limit the scope of the invention in any aspect.

EXAMPLE 1

Poly(isodecyl methacrylate) ("PIDMA"), a thermally removable porogen polymer particle, was formed by way of solution polymerization. A 1 L reactor was fitted with a thermocouple, a temperature controller, a purge gas inlet, a water-cooled reflux condenser with purge gas outlet, a stirrer, and an addition funnel. To the addition funnel was charged 420.15 g of a monomer mixture consisting of 407.75 g isodecyl methacrylate (98.1% purity), 2.40 g of a 50% solution of t-butyl peroctoate in mineral spirits (Lupersol PMS), and 10.00 g dodecyl mercaptan. Twenty percent (84.03 g) of the monomer mixture in the addition funnel was charged to the reactor containing 80.00 g toluene. The reactor was then flushed with nitrogen for 30 minutes before applying heat to bring the contents of the reactor to 105° C. When the contents of the reactor reached 105° C., the balance of the monomer mixture in the addition funnel was uniformly charged to the reactor over 60 minutes. At the end of the monomer mixture addition, 102.00 g of a chaser feed consisting of 2.00 g of a 50% solution of t-butyl peroctoate in mineral spirits (Lupersol PMS), and 100.00 g toluene was added uniformly over 90 minutes. At the end of the chaser feed, the contents of the reactor were held 60 minutes at 105° C. At the end of the 60 minute hold, 165.85 g toluene was added to the batch. The batch was then held at 105° C. for an additional 30 minutes to create a homogeneous solution. The product so formed exhibited a polymer solids content of 46.89 wt % and a number average molecular weight of 22,200 and a Mw/Mn distribution of 1.11 as measured by gel permeation chromatography ("GPC").

EXAMPLE 2

Methyl methacrylate-ethylene glycol dimethacrylate co-polymer, a thermally removable polymer particle porogen, was formed via solution polymerization.

Methyl methacrylate/diethylene glycol dimethacrylate (MMA/DEGMA) copolymer, a thermally removable porogen polymer particle, was formed by way of solution polymerization. A 500 mL reactor was fitted with a thermocouple, a temperature controller, a purge gas inlet, a water-cooled reflux condenser with purge gas outlet, a stirrer, and an addition funnel. To the addition funnel was charged 201.60 g of a monomer mixture consisting of 18.00 g methyl methacrylate (100% purity), 2.00 g diethyleneglycol dimethacrylate (100% purity), 1.60 g of a 75% solution of t-amyl peroxypivalate in mineral spirits (Luperox 554-M-75), and 180.00 g diisobutyl ketone ("DIBK"). The reactor, containing 180.00 g DIBK was then flushed with nitrogen for 30 minutes before applying heat to bring the contents of the reactor to 75° C. When the contents of the reactor reached 75° C., the monomer mixture in the addition funnel was uniformly charged to the reactor over 90 minutes. Thirty minutes after the end of the monomer mixture addition, the first of two chaser aliquots, spaced thirty minutes apart and consisting of 0.06 g of a 75% solution of t-amyl peroxypivalate in mineral spirits (Luperox 554-M-75) and 2.00 g DIBK, was added. At the end of the second chaser aliquot, the contents of the reactor were held 2½ hours at 80° C. to complete the reaction. The resulting polymer was isolated by precipitation with heptane, collected by filtration and dried under vacuum to yield a white powder. This material was redissolved in propyleneglycol monomethylether acetate. The porogen particles thus formed had a particle size distribution of from 0.8 to 5.0 nm with mean of 1.4 nm as determined by dynamic laser light scattering and a molecular weight of about 22,642 g/mol with a number average molecular weight of about 14,601 g/mol and Mw/Mn distribution of 1.6 as measured by GPC.

EXAMPLE 3

AAEM/ALMA copolymer, a thermally removable polymer particle porogen, was prepared by a semi-batch emulsion polymerization process. A monomer emulsion was made from a mixture of 17 g deionized water, 8.85 g of 28% w/w solids ammonium lauryl sulfate ("ALS"), 12.4 g acetoacetoxyethyl methacrylate ("AAEM"), and 1.78 g allyl methacrylate ("ALMA"). A reaction kettle was then prepared with 600 g deionized water, 15.0 g of 28% w/w solids ALS, and 0.15 g ammonium persulfate ("APS") in 1 mL deionized water. The reaction kettle was heated to 90° C. while being purged with nitrogen. One half of the monomer emulsion was added to the reaction kettle with stirring at 200 rpm. After 20 minutes, the remaining monomer emulsion was added. The kettle temperature was kept at 90° C. for 30 minutes, cooled to 55° C., and then a solution of 0.02 g t-butyl hydroxy peroxide ("t-BHP") in 1 mL of deionized water and a solution of 0.010 g sodium sulfoxylate formaldehyde ("SSF") in 1 mL of deionized water were added respectively. The reaction was then cooled to ambient temperature and the emulsion was filtered through 400 and 100 mesh sieves respectively.

The sample was isolated from water by freeze-drying to produce a white friable, free flowing powder. The resulting white powder was washed with copious amounts of doubly distilled and deionized water to remove most of the surfactant.

EXAMPLE 4

AAEM/ALMA copolymer, a thermally removable polymer particle porogen, was prepared by a batch emulsion polymerization process. A monomer emulsion was made from a mixture of 17 g deionized water, 8.85 g of 28% w/w solids ALS, 12.4 g AAEM, and 1.78 g ALMA in a bottle. A reaction kettle was then prepared with 600 g deionized water, 15.0 g of 28% w/w solids ALS, and 0.15 g APS in 1 mL deionized water. The reaction kettle was heated to 90° C. while being purged with nitrogen. The monomer emulsion was added all at once to the reaction kettle with stirring at 200 rpm. After 30 minutes, the temperature of the reaction flask was cooled to 75° C., and then a solution of 0.02 g t-BHP in 1 mL of deionized water was added. The reaction was cooled further to 55° C., and a solution of 0.010 g SSF in 2 mL of deionized water was added. The reaction was cooled to ambient temperature and the emulsion was filtered through 400 and 100 mesh sieves respectively.

EXAMPLE 5

A thermally removable polymer particle porogen was prepared by a gradual-add polymerization process. A monomer emulsion was made from a mixture of 100 g water, 1.60 g of 28% w/w solids ALS, 68 g ethyl acrylate ("EA"), 17 g methyl methacrylate ("MMA"), 12.5 g divinyl benzene ("DVB"), and 5 g methacrylic acid ("MAA"). A reaction kettle containing 445 g water, 22.2 g of 28% w/w solids ALS and 0.37 g APS was heated to 85° C. under a nitrogen atmosphere. The monomer emulsion was fed to the kettle over 90 minutes. The reaction was held at 85° C. for 30 minutes after the end of the feed, and then cooled to 65° C. After cooling, 1.33 g of 10% iron sulfate (FeSO$_4$) was added. After 1 minute, 0.2 g of 70% t-BHP was added and after 2 minutes 0.10 g of 100% isoascorbic acid ("IAA") and the reaction held for 15 minutes. A second chaser system was added in the same sequence and over the same time period. The reaction was then cooled to ambient temperature and filtered through a 400 mesh sieve.

EXAMPLE 6

Polymer particles useful as porogens in the present invention are reported in Table 1. These polymers were prepared according to the general procedures of Examples 1–5. The abbreviation "Mw" refers to the weight average molecular weight and the term "Mn" refers to the number average molecular weight. The term "Dist" refers to the ratio of Mw/Mn. The molecular weights were measured using a standard GPC method with tetrahydrofuran as the solvent.

TABLE 1

| Sample | Composition | Ratio | Mw | Mn | Dist |
|---|---|---|---|---|---|
| 1 | HEMA/DEGDMA | 90/10 | | | |
| 2 | MMA/DEGDMA | 90/10 | | | |
| 3 | MMA/DEGDMA | 90/10 | 19073 | 11183 | 1.7 |
| 4 | MMA/DEGDMA | 90/10 | 644 | 221 | 2.9 |
| 5 | MMA/DEGDMA | 90/10 | 771 | 3989 | 1.9 |
| 6 | MMA/MAPS/DEGDMA | 70/20/10 | 10640 | 4254 | 2.5 |
| 7 | MMA/MAPS/DEGDMA | 80/10/10 | 12819 | 8091 | 1.6 |
| 8 | MMA/MAPS/DEGDMA | 60/30/10 | | | |
| 9 | MMA/MAPS/DEGDMA | 40/50/10 | 43667 | 9047 | 4.8 |
| 10 | MMA/MAPS/DEGDMA | 20/70/10 | 166432 | 7404 | 22.5 |
| 11 | MAPS/DEGDMA | 90/10 | 11683 | 3484 | 3.4 |
| 12 | MMA/MAPS | 88.9/11.1 | 15965 | 7424 | 2.2 |
| 13 | BA/DEGDMA | 90/10 | 51007 | 29065 | 1.8 |
| 14 | MMA/MAPS/PETTA | 80/10/10 | | | |
| 15 | MMA/MAPS/PPG4000DMA | 80/10/10 | | | |
| 16 | MMA/MAPS/DPEPA | 80/10/10 | | | |
| 17 | MMA/MAPS/TMPTMA | 80/10/10 | | | |
| 18 | MMA/MAPS/DEGDMA | 75/10/15 | | | |
| 19 | MMA/MAPS/DEGDMA | 85/10/5 | | | |
| 20 | MMA/MAPS/DVB | 10/60/30 | 95613 | 12003 | 8.0 |
| 21 | MMA/MAPS/DVB | 20/60/20 | 110422 | 19814 | 5.6 |
| 22 | MMA/MAPS/DVB | 25/60/15 | | | |
| 23 | MMA/MAPS/DVB | 30/60/10 | | | |
| 24 | MMA/MAPS/DEGDMA | 20/70/10 | 35249 | 7438 | 4.7 |
| 25 | MMA/MAPS/DEGDMA | 30/60/10 | 35105 | 7003 | 5.3 |
| 26 | MMA/MAPS/DVB | 10/80/10 | 331732 | 29918 | 11.1 |
| 27 | STY/MAPS/DVB | 30/60/10 | 38455 | 12320 | 3.1 |
| 28 | BA/MAPS/DVB | 30/60/10 | 499094 | 36317 | 13.7 |
| 29 | BA/MAPS/DVB | 10/80/10 | 312848 | 16102 | 19.4 |

TABLE 1-continued

| Sample | Composition | Ratio | Mw | Mn | Dist |
|---|---|---|---|---|---|
| 30 | BA/TMSMA/DVB | 10/80/10 | 674730 | 30989 | 21.8 |
| 31 | BA/MOPTSOMS/DVB | 10/80/10 | 97530 | 12154 | 8.0 |
| 32 | BA/MOPMDMOS/DVB | 10/80/10 | 363561 | 37553 | 9.7 |
| 33 | BA/MAPS/TAT | 10/80/10 | 12201 | 5182 | 2.4 |
| 34 | ALMA/BA/DVB | 10/80/10 | | | |
| 35 | IBOMA/MAPS/DVB | 10/80/10 | | | |
| 36 | BA/DVB | 90/10 | 223436 | 29309 | 7.6 |
| 37 | BA/PGDMA | 90/10 | 26797 | 8242 | 3.3 |
| 38 | BA/ALMA | 90/10 | 104529 | 15967 | 6.5 |
| 39 | BA/TMPTMA | 90/10 | 39638 | 16306 | 2.4 |
| 40 | BA/DPEPA | 90/10 | 103945 | 18702 | 5.6 |
| 41 | EHA/DVB | 90/10 | | | |
| 42 | EHA/ALMA | 90/10 | | | |
| 43 | EHA/TMPTMA | 90/10 | | | |
| 44 | EHA/DPEPA | 90/10 | | | |
| 45 | STY/DVB | 90/10 | | | |
| 46 | STY/ALMA | 90/10 | | | |
| 47 | EHA/STY/ALMA | 20/70/10 | | | |
| 48 | EHA/STY/ALMA | 45/45/10 | | | |
| 49 | MMA/DEGDMA | 90/10 | 22642 | 14601 | 1.6 |

EXAMPLE 7

The compatibility of a porogen in hydrogen silsesquioxane ("HSQ") was determined for a variety of porogens.

The solubility parameters for HSQ were determined by defining the cloud point of the HSQ in binary solvent systems consisting of an HSQ soluble solvent and an HSQ insoluble solvent. The solubility parameter for the cloud point was defined as the weighted percentage of the two solvents. FIG. 1 illustrates a region of the area, i.e. the area under the curve, of solubility parameters for HSQ in a variety of solvents. The area of solubility parameters for HSQ in FIG. 1 was in the range of 14 to 21 $(J/cc)^{1/2}$ for delta v and in the range of 0 to 11 $(J/cc)^{1/2}$ for delta h.

Figure 2:
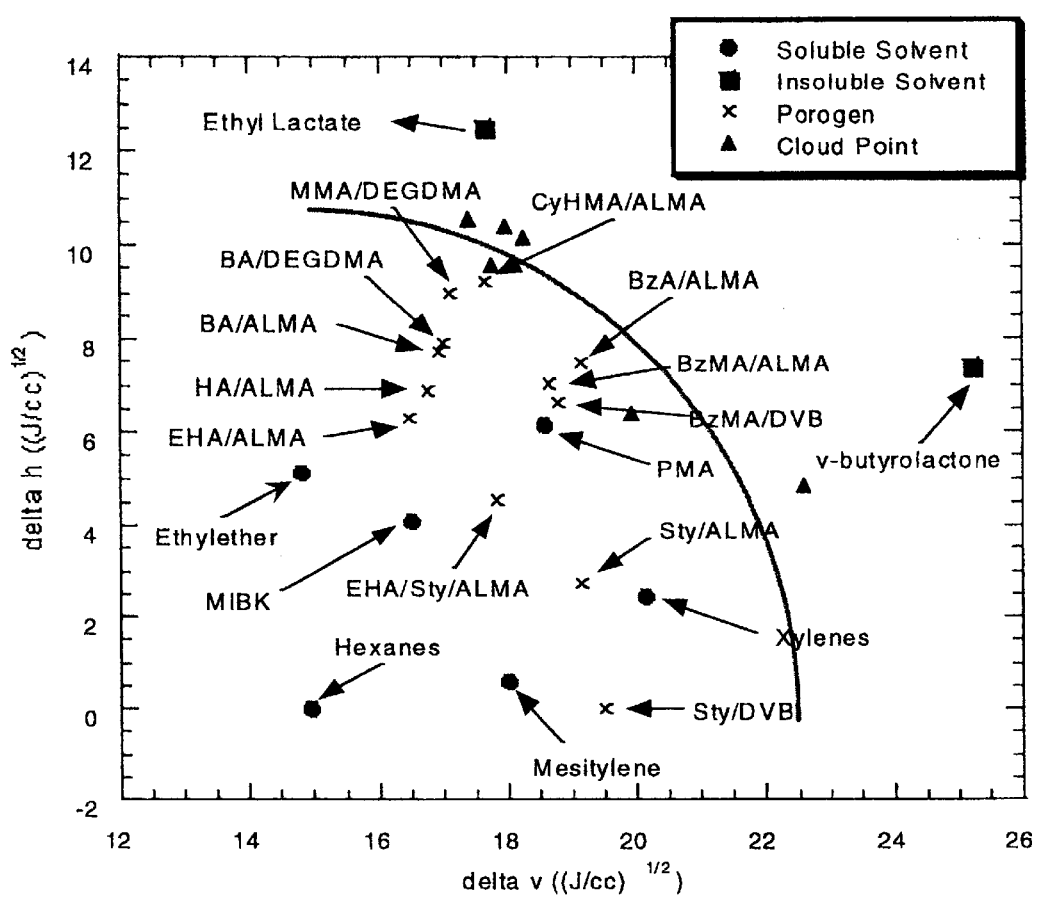
FIG. 2 illustrates a partial plot of the area of solubility parameters for certain porogens.

The solubility parameters for various porogens having a monomer/cross-linker molar ratio of 9:1 were calculated using the group contribution method. FIG. 2 illustrates a partial region of the area, i.e. the area under the curve, of solubility parameters for the various porogens evaluated.

Porogens that had solubility parameters in the range of 14 to 19 $(J/cc)^{1/2}$ for delta v and in the range of 0 to 9 $(J/cc)^{1/2}$ for delta h were compatible with HSQ, i.e. solutions and films containing these porogens were optically clear. Thus, it can be seen from FIG. 2 that the porogen comprising EHA/ALMA is closest to the center of the solubility parameter ranges and is thus compatible with HSQ.

EXAMPLE 8

The compatibility of a porogen in methyl silsesquioxane ("MeSQ") was determined for a variety of porogens.

Figure 3:
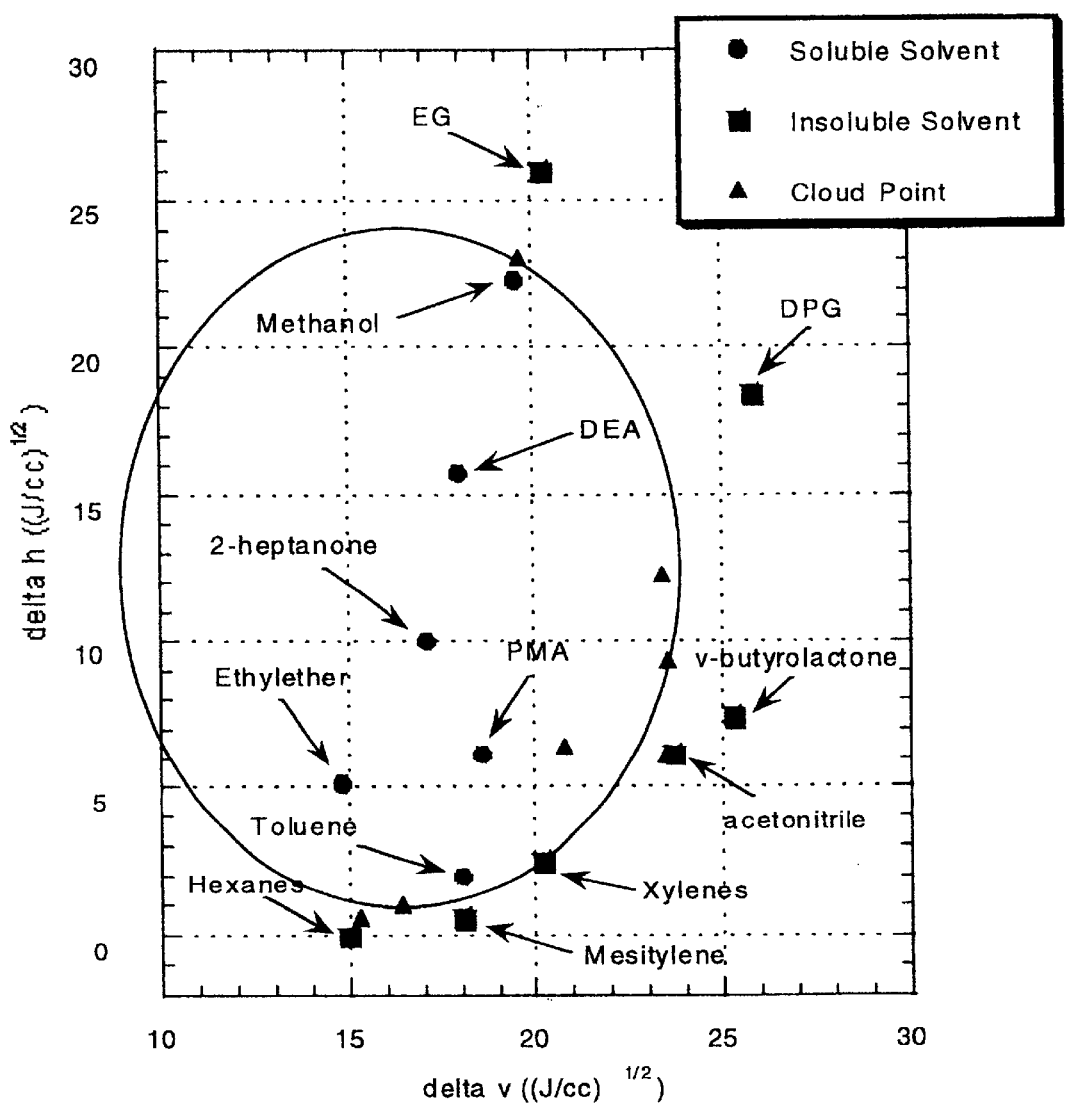
FIG. 3 illustrates a plot of the area of solubility parameters for methyl silsesquioxane.

The solubility parameters for MeSQ were determined by defining the cloud point of the MeSQ in binary solvent systems consisting of an MeSQ soluble solvent and an MeSQ insoluble solvent. The solubility parameter for the cloud point was defined as the weighted percentage of the two solvents. FIG. 3 illustrates a region of the area, i.e. the area under the curve, of solubility parameters for MeSQ in a variety of solvents. The area of solubility parameters for MeSQ in FIG. 3 was in the range of 9 to 24 $(J/cc)^{1/2}$ for delta v and in the range of 1 to 24 $(J/cc)^{1/2}$ for delta h.

Figure 4:
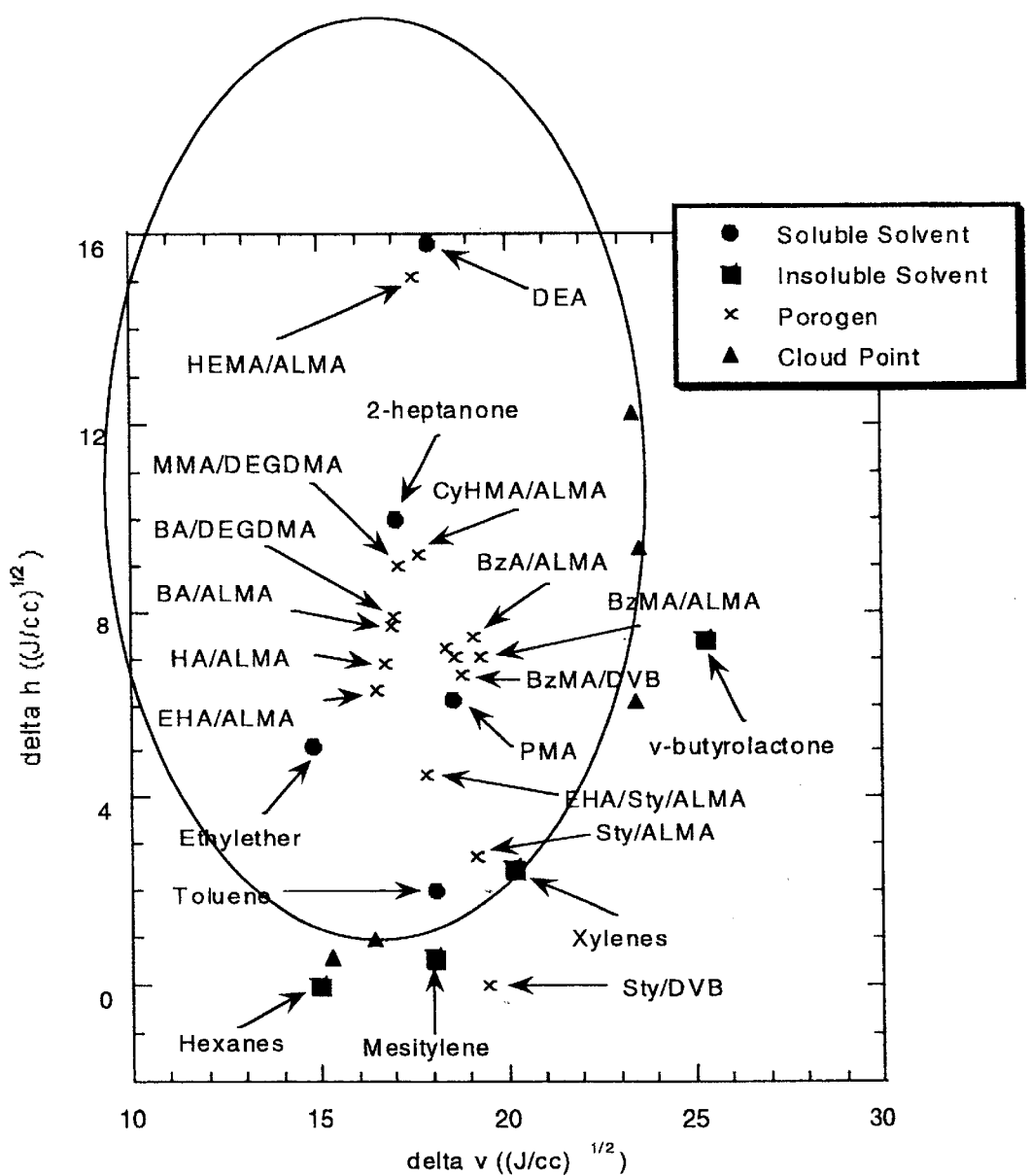
FIG. 4 illustrates a plot of the area of solubility parameters for certain porogens.

The solubility parameters for various porogens having a monomer/cross-linker molar ratio of 9:1 were calculated using the group contribution method. FIG. 4 illustrates a partial region of the area, i.e. the area under the curve, of solubility parameters for the various porogens evaluated.

Porogens that had solubility parameters in the range of 14 to 19 $(J/cc)^{1/2}$ for delta v and in the range of 6 to 18 $(J/cc)^{1/2}$ for delta h were compatible with MeSQ.

EXAMPLE 9

The compatibility of the porogens of Example 6 in HSQ and/or MeSQ was determined by visually inspecting a film of the dielectric matrix material and porogen that was spun cast on a silicon wafer. All visual inspections were by naked-eye under daylight. The results are reported in Table 2.

TABLE 2

| | HSQ | | | MeSQ | | |
|---|---|---|---|---|---|---|
| Sample | % Porogen | Clarity | Refractive Index | % Porogen | Clarity | Refractive Index |
| 2 | 20 | clear | | 20 | clear | |
| 3 | 50 | opaque | | | | |
| 4 | 20 | clear | | | | |
| 5 | 20 | opaque | | | | |
| 6 | 23 | gelled | | | | |
| 7 | 15, 25 | clear, clear | | 20 | opaque | |

TABLE 2-continued

| | HSQ | | | MeSQ | | |
|---|---|---|---|---|---|---|
| Sample | % Porogen | Clarity | Refractive Index | % Porogen | Clarity | Refractive Index |
| 8 | 20 | clear | | 20 | clear/opaque | |
| 9 | 20 | clear | 1.4 | 20, 40 | clear, opaque | |
| 10 | 20 | clear | | 20 | clear/opalescent | |
| 11 | 20, 40 | clear, clear | | 20, 40 | clear, clear | 1.36, 1.39 |
| 13 | 25, 50 | clear, opaque | 1.34, 1.22 | | | |
| 14 | 20 | opaque | | | | |
| 15 | 25 | clear | | | | |
| 16 | 25 | opaque | | | | |
| 21 | 20, 40 | opaque, opaque | | 20, 40 | opaque, clear | |
| 24 | 20, 40 | opaque, opaque | | 40 | clear | 1.35 |
| 25 | 20, 40 | clear, opaque | | | | |
| 26 | 20, 40 | opaque | | 20, 40 | clear, clear | 1.34, 1.38 |
| 27 | 40 | opaque | | | | |
| 29 | 40 | opaque | | 40 | clear | 1.31 |
| 31 | 50 | clear | 1.33 | 50 | smoky | 1.41 |
| 32 | 40 | clear/opaque | | | | |
| 33 | 40 | opaque | | | | |
| 34 | 50 | opaque | | 50 | clear | 1.36 |
| 35 | 50 | opaque | | 50 | clear/opaque | 1.36 |
| 36 | 25, 50 | clear, clear | 1.45, 1.38 | 50 | opaque | |
| 37 | 25 | clear | 1.35 | | | |
| 38 | 25, 50 | clear, clear | 1.37, 1.33 | 50 | opaque | |
| 39 | 25, 50 | clear, smoky | 1.36, 1.30 | 25, 50 | opaque, opaque | |
| 40 | 25, 50 | clear, clear | 1.37, 1.34 | 50 | opaque | |
| 41 | 50 | clear | 1.33 | 50 | opaque | |
| 42 | 50 | clear | 1.33 | 50 | opaque | |
| 43 | 50 | clear | 1.30 | 25, 50 | opaque | |
| 44 | 50 | clear | 1.37 | | | |
| 45 | 50 | opaque | | | | |
| 46 | 50 | opaque | | | | |
| 47 | 67 | opaque | | | | |
| 48 | 50 | clear | 1.37 | | | |
| 49 | 25 | clear | | | | |

EXAMPLE 10

Porous dielectric material was prepared using polymer particle porogens of the present invention. The PIDMA (0.12 g) from Example 1 was mixed in with a solution of hydrogen silsesquioxane in MIBK (1.0 g, 20 wt % HSQ). The sample was deposited on a silicon wafer as a thin coating using spin casting. The thickness (estimated at ~1 μm) of the film was controlled by the duration and spin rate of spread cycle, drying cycle and final spin cycle. The wafer was then processed at 150° C. for 2 minutes followed by heating in a quartz tube to 200° C. under an argon atmosphere. The oxygen content of the tube was monitored and maintained below 5 ppm before heating of the sample. After 30 minutes at 200° C. the furnace was heated at a rate of 10° C. per minute to a temperature of 350° C. and held for 30 minutes. The furnace was heated at a rate of 10° C. per minute to a temperature of 350° C. and held for 30 minutes. The decomposition of the polymer particle was accomplished at this temperature without expansion of the polymer.

EXAMPLE 11

Porous dielectric material was prepared using polymer particle porogens of the present invention. The ALMA cross-linked emulsion powder (0.3 g) prepared according to Example 3 and 0.6 g hydrogen silsesquioxane ("HSQ") were dissolved in 1.42 g PMA and 0.45 g ethyl lactate. The resulting solution was filtered through a 0.1 μm polytetrafluoroethylene filter. The sample was deposited on a silicon wafer as a thin coating using spin casting. The thickness of the film was up to 2 μm and was controlled by the duration and spin rate of spread cycle, drying cycle and final spin cycle. The wafer was then processed at 150° C. for 2 minutes followed by heating in a quartz tube to 200° C. under an argon atmosphere. The oxygen content of the furnace tube was monitored and maintained below 5 ppm before heating of the sample. After 30 minutes at 200° C. the furnace was heated at a rate of 10° C. per minute to a temperature of 350° C. and held for 30 minutes. Then the furnace was heated at a rate of 10° C. per minute to a temperature of 425° C. and held for 30 minutes. The decomposition of the porogen was accomplished at this temperature without expansion of the polymer. The porous dielectric matrix material had pore sizes of about 15 nanometers.

What is claimed is:

1. A method of manufacturing an integrated circuit comprising the steps of: a) depositing on a substrate a layer of a composition comprising polymerizable B-staged dielectric material having cross-linked polymeric porogen particles having a mean particle size of 1 to 200 nm dispersed therein; b) curing the B-staged dielectric material to form a dielectric matrix material without substantially removing the porogen particles; and c) subjecting the dielectric matrix material to conditions which at least partially remove the porogen particles to form a porous dielectric material layer without substantially degrading the dielectric material; wherein the porogen particles contain from 1 to 100% cross-linking agent based on the weight of the porogen, wherein the porogen particles are not reacted with the B-staged dielectric material, and wherein the porogen particles are soluble or miscible in the B-staged dielectric material, the solvent used to dissolve the B-staged dielectric material, or both.

2. The method of claim 1 wherein the dielectric material is a siloxane.

3. The method of claim 2 wherein the siloxane is a silsesquioxane.

4. The method of claim 1 wherein the porogen is at least partially removed by heat.

5. The method of claim 1 wherein the porogen comprises one or more polymers selected from the group comprising HEMA/DEGDMA, MMA/DEGDMA, MMA/MAPS/DEGDMA, MMA/MAPS/PETTA, MMA/MAPS/PPG4000DMA, MMA/MAPS/DPEPA, MAPS/DEGDMA, BA/DEGDMA, MMA/MAPS/TMPTMA, MMA/MAPS/DVB, STY/MAPS/DVB, BA/MAPS/DVB, BA/TMSMA/DVB, BA/MOPTSOMS/DVB, BA/MOPMDMOS/DVB, BA/MAPS/TAT, ALMA/BA/DVB, IBOMA/MAPS/DVB, IBOA/MAPS/DVB, BA/DVB, BA/PGDMA, BA/ALMA, BA/TMPTMA, BA/DPEPA, EHA/DVB, EHA/ALMA, EHA/TMPTMA, EHA/DPEPA, STY/DVB, STY/ALMA, EHA/STY/ALMA, MMA/BA/ALMA, STY/MMA/DVB, MMA/butadiene/STY, MMA/EA/ALMA, BA/ALMA/MATS, STY/MATS/DVB, MMA/BA/MATS, STY/MMA/MATS/DVB, MMA/BA/MATS/ALMA, BzA/TMPTMA, BzA/DVB, IDMA/BzMA and MMA/ALMA/MATS.

6. The method of claim 1 wherein the porogen has a mean particle size in the range of 1 to 50 nm.

7. The method of claim 1 wherein the porogen has a polydispersity in the range of 1 to 20.

8. The method of claim 1 further comprising a solvent selected from the group comprising methyl isobutyl ketone, diisobutyl ketone, 2-heptanone, γ-butyrolactone, γ-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes, and mixtures thereof.

9. The method of claim 1 wherein the B-staged dielectric material comprises hydrogen silsesquioxane and the porogen comprises EHA.

10. An integrated circuit prepared by the method of claim 1.

11. A method of manufacturing an integrated circuit comprising the steps of:

a) depositing on a substrate a layer of a composition comprising removable cross-linked polymeric porogen particles and a polymerizable B-staged dielectric material comprising hydrogensilsesquioxane;

b) curing the B-staged dielectric material to form a dielectric matrix material without substantially degrading the porogen particles; and c) subjecting the dielectric matrix material to conditions which at least partially remove the porogen particles to form a porous dielectric material without substantially degrading the dielectric material;

wherein the polymeric porogen particles have a mean particle size of 1 to 1000 nm, contain from 1 to 100% cross-linking agent based on the weight of the porogen and are soluble or miscible in the B-staged dielectric material, the solvent used to dissolve the B-staged dielectric material, or both.

12. The method of claim 11 wherein the cross-linked polymeric porogen particles have a mean particle size of 1 to 200 nm.

13. The method of claim 11 wherein the porogen particles comprise as polymerized units one or more monomers selected from the group consisting of alkyl(meth)acrylates and vinylaromatic monomers.

14. The method of claim 11 wherein the B-staged dielectric material comprises a mixture of alkylsilsesquioxane and hydrogensilsesquioxane.

15. The method of claim 11 further comprising the steps of: d) patterning the dielectric layer; e) depositing a metallic film onto the patterned dielectric layer; and f) planarizing the film to form an integrated circuit.

16. The method of claim 1 further comprising the steps of: d) patterning the dielectric layer; e) depositing a metallic film onto the patterned dielectric layer; and f) planarizing the film to form an integrated circuit.

17. The method of claim 1 wherein the B-staged dielectric material comprises inorganic diectric materials or organic dielectric materials.

* * * * *